(12) United States Patent
Hwang et al.

(10) Patent No.: US 10,761,110 B2
(45) Date of Patent: Sep. 1, 2020

(54) CONTACT FOR TESTING SEMICONDUCTOR DEVICE, AND TEST SOCKET DEVICE THEREFOR

(71) Applicants: Dong Weon Hwang, Gyeonggi-do (KR); Jae Suk Hwang, Berkeley, CA (US); Jae Baek Hwang, Seoul (KR)

(72) Inventors: Dong Weon Hwang, Gyeonggi-do (KR); Jae Suk Hwang, Berkeley, CA (US); Jae Baek Hwang, Seoul (KR)

( * ) Notice: Subject to any disclaimer, the term of this patent is extended or adjusted under 35 U.S.C. 154(b) by 84 days.

(21) Appl. No.: 16/110,045

(22) Filed: Aug. 23, 2018

(65) Prior Publication Data
US 2019/0317128 A1   Oct. 17, 2019

(30) Foreign Application Priority Data

Apr. 13, 2018  (KR) .......................... 10-2018-0043296

(51) Int. Cl.
| | | |
|---|---|---|
| *G01R 1/067* | (2006.01) | |
| *G01R 1/04* | (2006.01) | |
| *G01R 31/26* | (2020.01) | |

(52) U.S. Cl.
CPC ....... *G01R 1/06716* (2013.01); *G01R 1/0408* (2013.01); *G01R 31/2601* (2013.01)

(58) Field of Classification Search
None
See application file for complete search history.

(56) References Cited

U.S. PATENT DOCUMENTS

2013/0207682 A1*  8/2013  Lee .................... G01R 1/06722
                                                            324/755.05
2015/0377925 A1    12/2015  Hwang et al.

FOREIGN PATENT DOCUMENTS

| CN | 105074475 A | 11/2015 |
|---|---|---|
| CN | 106561084 A | 4/2017 |
| JP | 2006266869 A | 10/2006 |
| JP | 2009156710 A | 7/2009 |
| JP | 4921344 B2 | 4/2012 |
| JP | 2012207994 A | 10/2012 |
| JP | 2013205191 A | 10/2013 |
| JP | 2016223996 A | 12/2016 |

(Continued)

OTHER PUBLICATIONS

International Search Report issued by ISA/KR in connection with PCT/KR2018/004617 dated Oct. 26, 2018.

(Continued)

*Primary Examiner* — Clayton E. LaBalle
(74) *Attorney, Agent, or Firm* — Levenfeld Pearlstein, LLC

(57) ABSTRACT

Disclosed is related generally to a contact for testing a semiconductor device and a socket device therefor. The contact of the present invention, being a spring contact configured in an integrated body by blanking and bending a metal board, includes: an elastic part composed of various strips in a fixed pattern, and sharp end parts provided on opposite ends of the elastic part, respectively. Preferably, with a filler having conductivity and elasticity being filled in space volume, the contact of the present invention has excellent durability and electrical characteristics. In addition, the test socket according to the present invention, being the rubber type adopting the above-stated contacts, provides an appropriate effect for a test of a semiconductor device having a fine pitch.

28 Claims, 15 Drawing Sheets

(56) References Cited

FOREIGN PATENT DOCUMENTS

| KR | 20060062824 A | 6/2006 |
| KR | 101266123 B1 | 5/2013 |
| KR | 20170108522 A | 9/2017 |
| KR | 1020170108522 A | 9/2017 |

OTHER PUBLICATIONS

Taiwan Search Report issued by TIPO in connection with Taiwan Patent Application No. 107129080 dated Nov. 18, 2019.

\* cited by examiner

CONTACT FOR TESTING SEMICONDUCTOR DEVICE, AND TEST SOCKET DEVICE THEREFOR

CROSS REFERENCE TO RELATED APPLICATION

The present application claims priority to Korean Patent Application No. 10-2018-0043296, filed Apr. 13, 2018, the entire contents of which is incorporated herein for all purposes by this reference.

BACKGROUND OF THE INVENTION

Field of the Invention

The present invention relates generally to a contact and a test socket device for testing a semiconductor device. More particularly, the present invention relates to a contact and a test socket device for realizing electrical connection between contact points and leads in such a way of electrically connecting leads of an IC and a pad of a PCB by being built in a test socket to test the IC, or electrically connecting leads of an IC of a PCB and CPU installed inside electrical appliances such as a personal computer (PC), a mobile phone, and so on.

Description of the Related Art

Generally, as a parts to inspect semiconductor devices for defects in a post-processing step for semiconductors, a test socket is a part to transfer a signal transmitted through a test device and a test board to a device during a test process by being brought into contact with the device.

The test socket is required to have characteristics of mechanical contact required for each device to be precisely brought into contact with the test board by moving to an exact location, and electrical contact to be able to stably transfer a signal without distortion at a contact point.

Since the test socket is a consumable part of which mechanical and electrical characteristics are degraded due to repetitive test processes, cost reduction of the test process is eagerly demanded by increasing a number of times that the test socket can be used through a life extension of the test socket.

Meanwhile, two major causes may determine a life time of the test socket. The first cause is a problem that the socket is damaged by unstable contact in a mechanical part. The second cause is a problem that contamination of a contact area due to continuous contact increases contact resistance, thereby causing electrical characteristics to be unstable.

Commonly used test sockets may be classified into a pin type and a rubber type depending on types of conductive methods connecting a semiconductor device and the test device.

FIGS. 1A and 1B depict cross-sectional diagrams illustrating a commonly used pin type and rubber type test sockets, respectively.

With reference to FIG. 1A, a pin type test socket 10 includes: a socket body 11 provided with a plurality of contact pins 12 having elasticity by being formed to be bent; a cover 13 being able to move upward and downward on an upper part of the socket body 11; and a latch 14 being assembled to be gatherable to the socket body 11 to allow a device 20 to be fastened or unfastened by being interlocked with upward and downward movements of the cover 13.

The contact pins 12 having elasticity into upward and downward directions play a role in electrically connecting leads of the device and a pad of the test device. Depending on materials and types of the leads of the device and the pad of the test device, various pins are available, and there is a pogo pin composed of a plunger, a barrel, and a spring, for example.

The latch 14 is formed with a guide slot 14a which is combined with a guide pin 15a, and the guide pin 15a is fastened to a driving link 15 of which one end is combined with the cover 13 with interposition of a hinge. The cover 13 is elastically supported by a spring 16.

The pin type test socket 10 configured as such allows the device 20 to be loaded with the latch 14 being spread outwards when the cover 13 is pressed, and the device 20 to be fastened with the latch 14 pressing an upper part of the device 20 by an elastic restoring force of the coil spring 15 when the cover 13 is released.

However, the pin type test socket 10 has a spiral or curved structure for the contact pins 12 to have elasticity, whereby a problem of a signal loss occurs as a current path becomes to be long, and is thus a disadvantageous structure in a microwave frequency range. In addition, in a test socket with a fine pitch, manufacturing process of a structure of a housing in which the contact pins 12 are received becomes complex and a problem of large cost increase occurs.

Next, with reference to FIG. 1B, a rubber type test socket includes: a connector body 31 having elasticity with an insulating silicon powder being solidified; and a conductive silicon part 32 being formed through the connector body 31 perpendicularly corresponding to solder balls (leads) 21 of the device 20. The conductive silicon part 32 has approximately a cylindrical shape passing through the connector body 31 perpendicularly.

When a manufacturing method of the rubber type test socket like this is performed, conductive powder of a silicon mixture is forced to be gathered at a location allowing an electric current to be applied when an electric current is applied to a location the conductive silicon part 32 is to be formed after inserting the silicon mixture of insulating powder and conductive powder being mixed at a fixed ratio in a mold and melting the mixture, and the test socket 30 is finally obtained by being formed with the conductive silicon part 32 by solidifying the melted silicon mixtures.

A bottom of the conductive silicon part 32 of the test socket 30 manufactured as described is brought into contact with a pad of the test device located below the device, and a top of the conductive silicon part 32 is electrically brought into contact with the solder balls 21 by being pressurized at a fixed pressure on the top by the device 20.

Since the rubber type test socket 30 is made of a soft material having elasticity, stable electrical contact is established with a top surface of the conductive silicon part 32 covering the solder ball. At this time, a central part of the conductive silicon part 32 expands convexly.

However, losing elasticity in repetitive test processes, the rubber type test socket 30 has a drawback that a service life thereof is noticeably reduced. Accordingly, cost increase occurs because of a small number of times of use and frequent replacement.

Specifically, it is not easy for the rubber type test socket to secure a sufficient distance L for insulation between the conductive silicon parts 32 adjacent to each other in a device with fine pitches, whereby the rubber type test socket has a high potential for occurrence of short circuits.

Accordingly, securing of the sufficient distance L for the insulation between the conductive silicon parts 32 is very important when a distance L between the conductive silicon parts 32 adjacent to each other is short in the test socket for a semiconductor device with a fine pitch.

However, as described earlier, the rubber type test socket is famed with the conductive silicon part 32 with the conductive powder being gathered along the current path by applying voltage to a melted silicon mixture being mixed with insulating powder and conductive powder. Accordingly, the conductive powder being gathered along the current path may not be distributed in an accurately defined size d, thereby having a section δ where a density of the conductive powder is continuously decreasing.

Accordingly, the rubber type test socket 30 comes to have a fixed damping section δ other than a diameter d where the conductive silicon part 32 is accurately defined, thereby having a problem that the distance L for the insulation between the conductive silicon parts 32 adjacent to each other becomes short. Consequentially, the rubber type test socket 30 is considerably disadvantageous for use as the test socket for a semiconductor device with fine pitches.

In addition, the rubber type test socket 30 has to apply voltage for a substantial amount of time to obtain a sufficient conductive powder density along the current path by applying voltage to the melted silicon mixture in the manufacturing process thereof, thereby having a drawback that the manufacturing process takes a long time.

In response to the above described problems, the present inventor developed hybrid contacts and a new type of test socket device which may solve the drawbacks of and combine the advantages of conventional pin type and rubber type test sockets, thereby culminating in this patent application.

The foregoing is intended merely to aid in the understanding of the background of the present invention, and is not intended to mean that the present invention falls within the purview of the related art that is already known to those skilled in the art.

DOCUMENTS OF RELATED ART

Patent Document (Patent Document 1) Korean unexamined patent publication No. 10-2006-0062824 (Publication Date: 2006 Jun. 12)

SUMMARY OF THE INVENTION

Accordingly, the present invention has been made keeping in mind the above problems occurring in the related art, and the present invention is intended to propose a test socket device appropriate for a semiconductor device with a fine pitch. Particularly, the present invention proposes the test socket device which not only has excellent electrical characteristics but also has an extended service life by solving the drawbacks of conventional pin type and rubber type test socket devices.

In addition, the present invention is intended to propose a contact having a structure appropriate for a test socket device for a semiconductor device with a fine pitch.

In order to achieve the above object, there is provided a contact for testing a semiconductor device and a socket device therefor. The contact configured in an integrated body by blanking a metal board and rolling the metal board into a cylindrical shape according to one aspect of the present invention includes: an elastic part being bent into a cylindrical shape by being connected in a zigzag pattern with unit strips each composed of a horizontal strip and a vertical strip extending perpendicularly from one end of the horizontal strip and having a shorter length than the horizontal strip; an upper head part being bent into the cylindrical shape by being provided with an upper sharp end part formed by protruding upwards and extending from an uppermost end of the elastic part; and a lower head part being bent into the cylindrical shape by being provided with a lower sharp end part formed by protruding downwards and extending from a lowermost end of the elastic part.

The contact configured in an integrated body by blanking a metal board and rolling the metal board into a cylindrical shape according to another aspect of the present invention includes: an elastic part being bent into a cylindrical shape by being connected with a plurality of closed loop strips of an equal size in series by nodes; an upper head part being bent into the cylindrical shape by being provided with an upper sharp end part formed by protruding upwards and extending from an uppermost end of the elastic part; and a lower head part being bent into a cylindrical shape by being provided with a lower sharp end part formed by protruding downwards and extending from a lowermost end of the elastic part.

Preferably, the contact further includes a filler having conductivity and elasticity by being filled in a cylindrical shape into, at least, an elastic section between the upper head part and the lower head part.

In addition, the test socket including the above-stated contact, according to the present invention includes: a mounting part being formed with a plurality of through holes in each of which the contact is inserted and located corresponding to a lead of a device; and an insulation body part having elasticity to allow the contact to be fastened to the mounting part in an integrated body.

The contact of the present invention, which is a spring contact configured in an integrated body by blanking and bending a metal board, includes an elastic part composed of single or closed strips in a fixed pattern, and sharp end parts each provided on opposite ends of the elastic part. Preferably, with a filler having conductivity and elasticity being filled in a space volume, the contact of the present invention can solve the drawbacks of test socket devices of each of a pin type and a rubber type, have excellent electrical characteristics, and provide an effect allowing the service life thereof to be extended.

In addition, the test socket according to the present invention, being the rubber type adopting the above-stated contact, can solve the drawbacks of the conventional rubber type test socket and, particularly, provides an appropriate effect for a test of a semiconductor device having a fine pitch.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE INVENTION

Figure 1A:
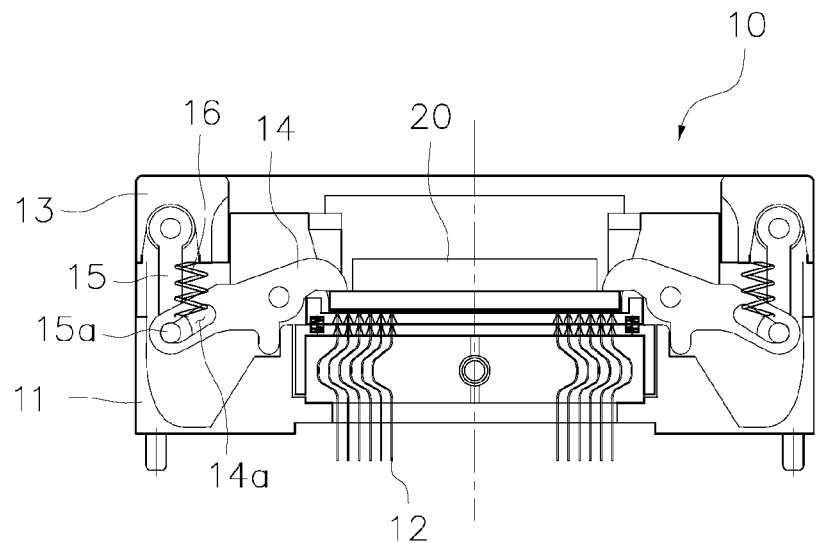
FIGS. 1A and 1B depict cross-sectional diagrams illustrating general pin type and rubber type test sockets, respectively.
Figure 1B:
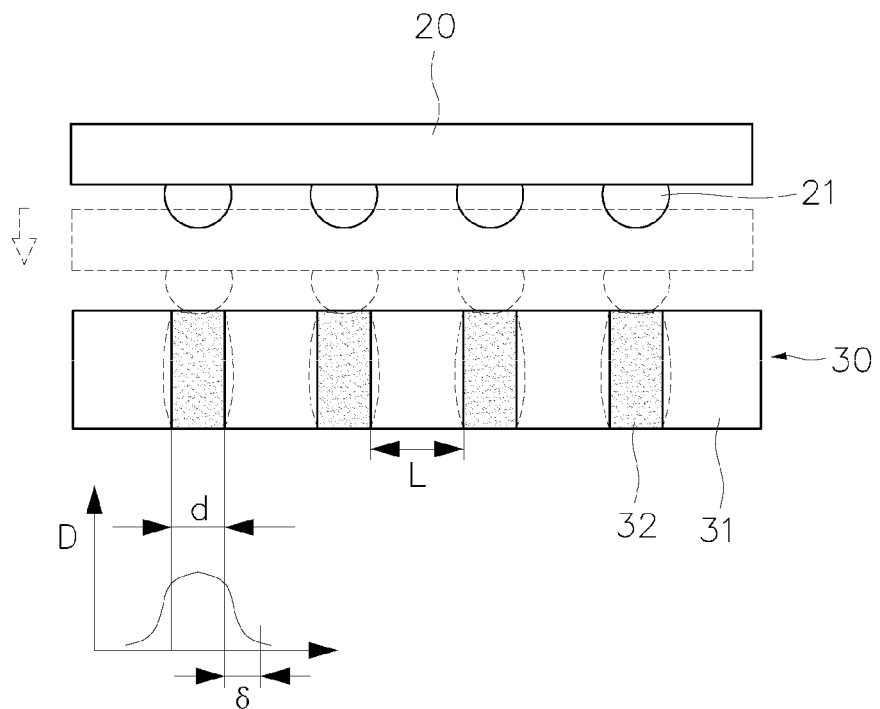

Hereinbelow, exemplary embodiments of the present invention will be described in detail with reference to the accompanying drawings. Throughout the drawings, the same reference numerals will refer to the same or like parts. First, terms and words used in present description and claims should not be understood by conventional meanings or meanings defined in dictionaries, but should be understood in accordance with a technical idea of the present disclosure on the basis of a principle that an inventor is entitled to appropriately define a concept of each term in order to describe the present disclosure of himself or herself in a best way.

Accordingly, embodiments described in the present description and composition illustrated in drawings are merely most preferable embodiments of the present invention, and do not represent all technical concept of the present invention. Accordingly, it should be understood that various equivalents or modifications are possible.

The present invention has technical features wherein a contact is configured in an integrated body by rolling a strip formed by blanking a metal board into a cylindrical shape, and a hybrid type contact composed of a conductive elastic filling part is filled in of the cylindrical structure by using the contact as a basis. The contact according to the most preferable embodiment of the present invention will be described in detail with reference to the accompanying drawings.

First Embodiment

Figure 2A:
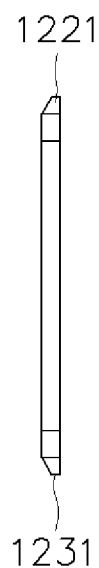
FIGS. 2A, 2B, 2C, 2D, 3A and 3B are drawings illustrating a contact according to a first embodiment of the present invention.
Figure 2B:
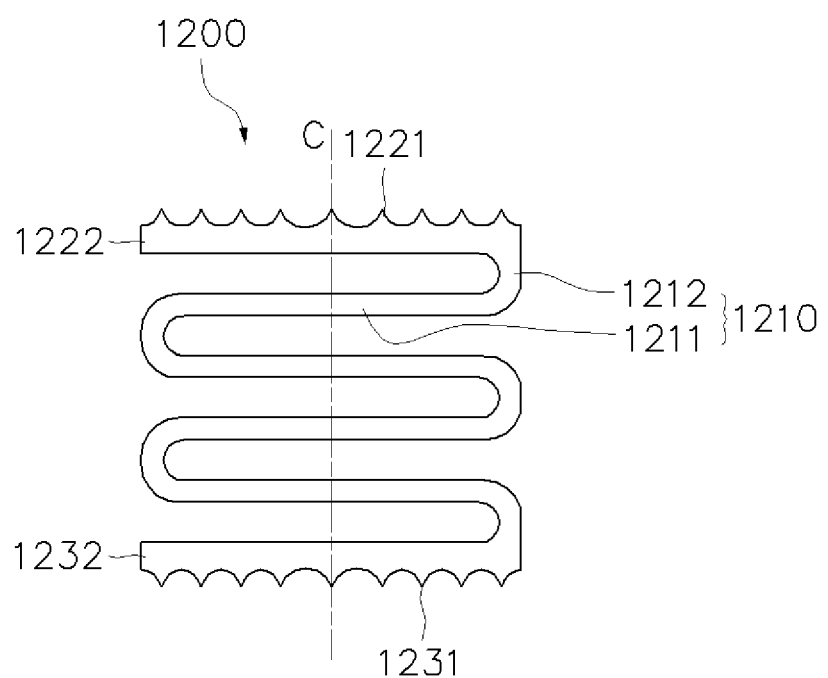
Figure 2C:
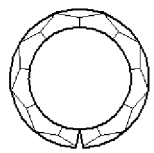
Figure 2D:
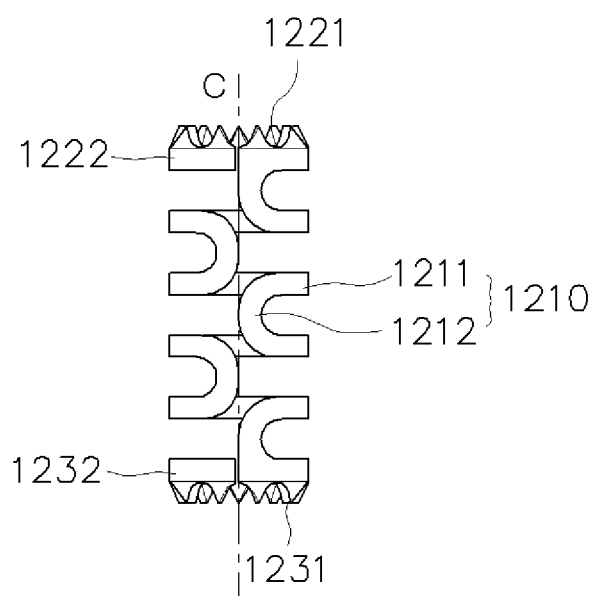
Figure 3A:
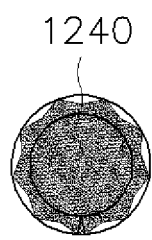
Figure 3B:
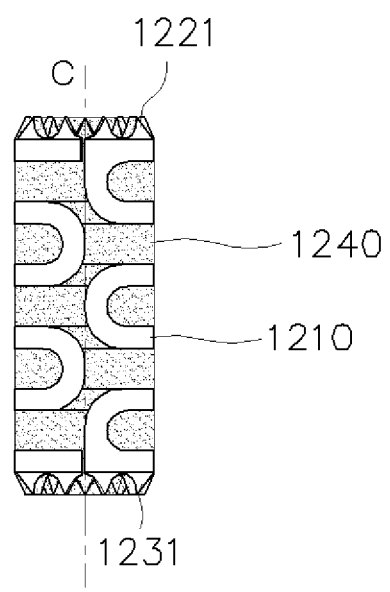

FIGS. 2A, 2B, 2C, 2D, 3A and 3B are drawings illustrating a contact according to a first embodiment of the present invention, wherein FIGS. 2A and 2B depict a left side view and a plan view of the deployed state of a flat plate pattern, respectively, FIGS. 2C and 2D depict a plan view and a front view of a contact processed by rolling, respectively, and FIGS. 3A and 3B depict a plan view and a front view of a hybrid type contact filled with a filler, respectively.

With reference to FIGS. 2A to 2D, the flat plate pattern of a contact 1200 according to a present embodiment includes an elastic part 1210 being connected in a zigzag pattern with a unit strip 1211 and 1212 composed of a horizontal strip 1211 and a vertical strip 1212; an upper head part 1222 being provided with an upper sharp end part 1221 formed protruding upwards and extending from an uppermost end of the elastic part 1210; and a lower head part 1232 provided with a lower sharp end part 1231 formed protruding downwards and extending from a lowermost end of the elastic part 1210.

A contact may be manufactured into a fixed pattern by blanking a board made of materials such as mostly beryllium copper (BeCu), a copper alloy, or stainless steel (SUS), and then may be manufactured by bending the board blanked into the fixed pattern into a cylindrical shape. In addition, surfaces of the contact may be plated with gold, palladium (Pd), palladium-nickel (PdNi), or palladium-cobalt (PdCo), and so on.

The elastic part 1210 includes a unit strip 1211 and 1212 composed of a horizontal strip 1211 and a vertical strip 1212, wherein the vertical strip 1212 extends perpendicularly from one end of the horizontal strip 1211 and has a shorter length than the horizontal strip 1211, and a plurality of the unit strips 1211 and 1212 is connected in the zigzag pattern.

The upper head part 1222 and the lower head part 1232 are provided with the upper side sharp end part 1221 and the lower side sharp end part 1231 configured in a plurality of teeth along edges, and are brought into contact with leads of a semiconductor device and pads of a test apparatus, respectively.

The upper head part 1222 and the lower head part 1232 are illustrated equal to the horizontal strip 1211 of the elastic part 1210 in the present embodiment, but are not limited to the present embodiment, and may have widths and lengths different from the horizontal strip 1211.

The contact 1200 having the flat plate pattern described above may be allowed to be bent into a cylindrical shape, and a bending of the contact 1200 into the cylindrical shape may be accomplished by taking a center of the horizontal strip 1211 as a vertical axis C.

Next, as illustrated in FIGS. 3A and 3B, the contact 1200 configured in this manner may be filled with a filler 1240 having conductivity and elasticity inside the cylindrical shape thereof. For reference, the contact filled with the filler in the present invention will be named as a hybrid contact by specifically differentiating from one having no filler.

The filler 1240 in the present embodiment may be an insulating material mixed with particles having conductivity. For example, a mixture of conductive powders and insulating silicon powders is filled in the contact of the cylindrical shape, and a hybrid contact having conductivity and elasticity may be obtained by solidifying the mixture after the mixture is melted.

Meanwhile, a mold may be used in a process of melting and solidifying the mixture. The mold is formed with a receiving hole in which a contact performed in bending process is inserted and located. Accordingly, the mixture is inserted into the receiving hole with the contact having been inserted thereinto. Then, the hybrid contact may be obtained by separating the mixture from the mold after melting and solidifying the mixture.

Particles having conductivity may be particles of metal material, or particles plated on surface of particles of metal or non-metal material with gold, silver, palladium (Pd), palladium-nickel (PdNi), or palladium-cobalt (PdCo), or mixing of carbon nanotubes.

As a main basic material having insulating properties composing the filler 1240, elastic high-molecular substances may be used, and silicon may be representatively used, but the basic material is not limited thereto.

In addition, the present embodiment illustrates the filler 1240 is filled into a cylindrical shape from the upper side sharp end part 1221 to the lower side sharp end part 1231.

However, filling may be implemented into the cylindrical shape only in sections of the elastic parts 1210 where a relatively large electrical resistance is generated, excluding sections of the upper head part 1221 and the lower head part 1231, as necessary.

Second Embodiment

Figure 4A:
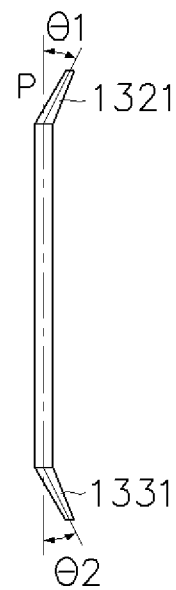
FIGS. 4A, 4B, 4C, 4D, 5A and 5B are drawings illustrating a contact according to a second embodiment of the present invention.
Figure 4B:
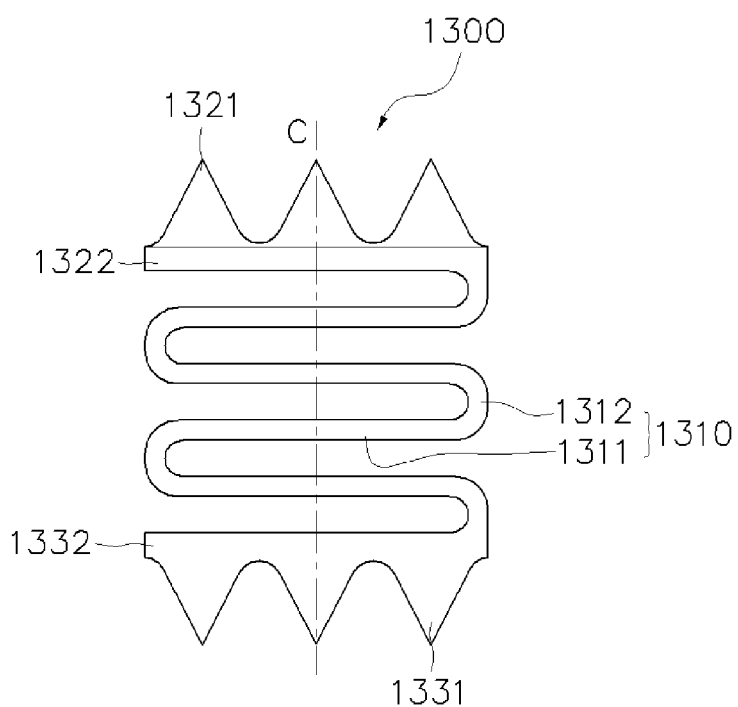
Figure 4C:
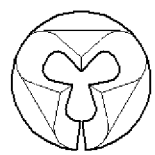
Figure 4D:
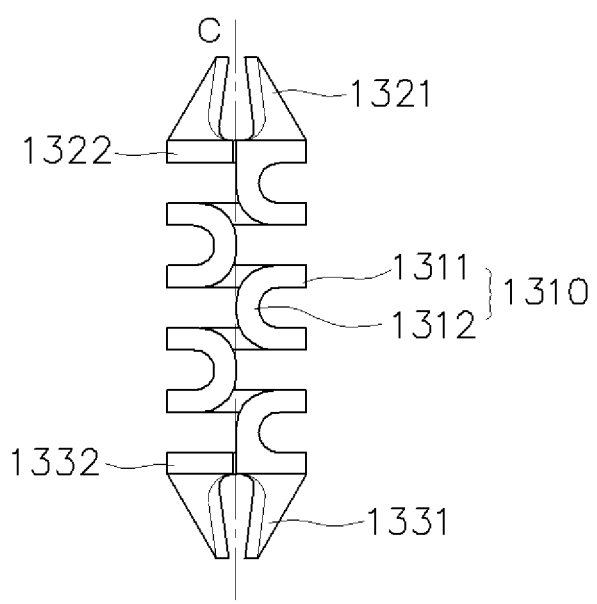
Figure 5A:
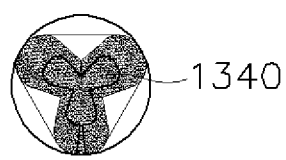
Figure 5B:
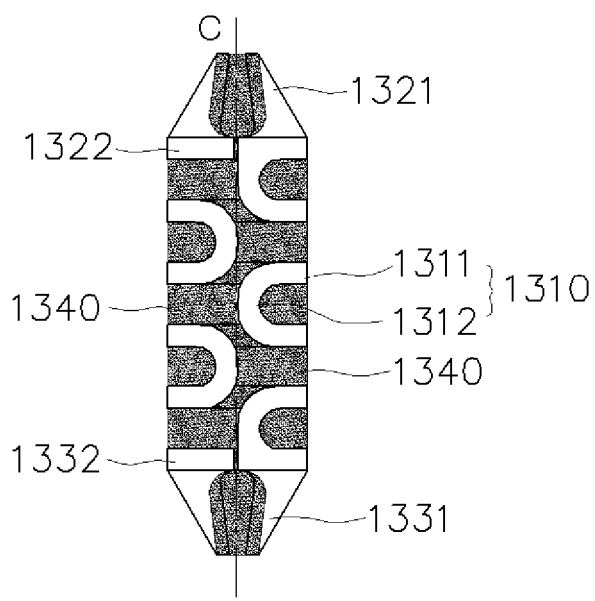

FIGS. 4A, 4B, 4C, 4D, 5A and 5B are drawings illustrating a contact according to a second embodiment of the present invention, wherein FIGS. 4A and 4B depict a left side view and a front view of the deployed state of a flat plate pattern, respectively, FIGS. 4C and 4D depict a plan view and a front view of a contact processed by rolling, respectively, and FIGS. 5A and 5B depict a plan view and a front view of a hybrid type contact filled with a filler, respectively.

With reference to FIGS. 4A to 4D, the flat plate pattern of a contact 1300 according to a present embodiment includes an elastic part 1310 connected in a zigzag pattern with a unit strip 1311 and 1312 composed of a horizontal strip 1311 and a vertical strip 1312; an upper head part 1322 provided with an upper sharp end part 1321 formed protruding upwards and extending from an uppermost end of the elastic part 1310; and a lower head part 1332 being provided with a lower sharp end part 1331 formed protruding downwards and extending from a lowermost end of the elastic part 1310.

Specifically, an upper side sharp end part 1321 is configured in a plurality of teeth each having a slope of a pre-set angle θ1 with respect to a plane P of the flat plate pattern. Accordingly the upper side sharp end part 1321 has a conic shape by being bent toward a center of a cylindrical shape. In addition, a lower side sharp end part 1331 is also configured in a plurality of teeth each having a slope of a pre-set angle θ2 with respect to the plane P of the flat plate pattern, thereby having a conic shape by being bent toward the center of the cylindrical shape.

With reference to FIGS. 5A and 5B, the contact 1300 configured in this manner is filled with a filler 1340 having conductivity and elasticity inside the cylindrical shape thereof, whereby a hybrid contact may be obtained.

As described in the first embodiment, the filler 1340 may be manufactured by filling a mixture of conductive powders and insulating silicon powders in the contact 1300 and by solidifying the mixture. In addition, the materials of the contacts and the fillers and filling sections in embodiments of the present invention are the same as those in the first embodiment. Accordingly, overlapping descriptions will be omitted hereinafter.

Third Embodiment

Figure 6A:
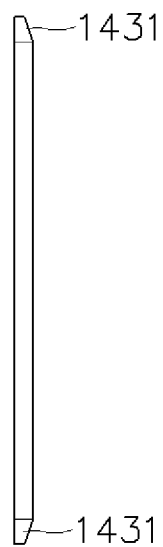
FIGS. 6A, 6B, 6C, 6D, 7A and 7B are drawings illustrating a contact according to a third embodiment of the present invention.
Figure 6B:
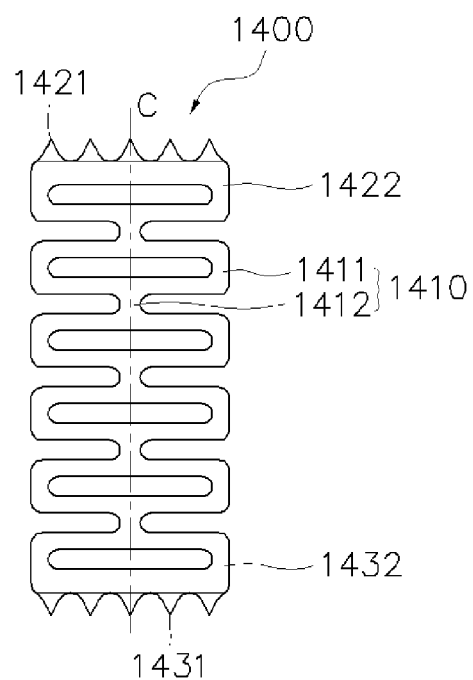
Figure 6C:
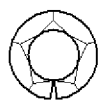
Figure 6D:
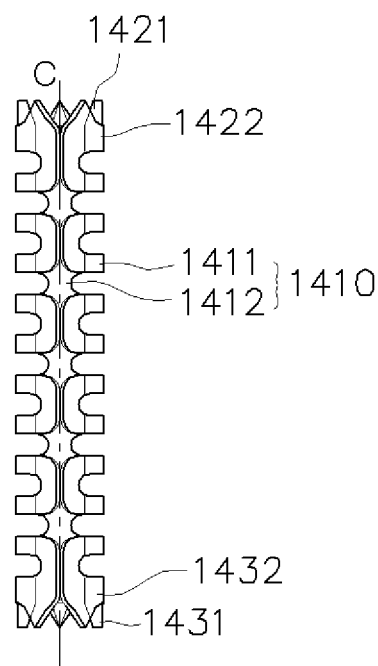
Figure 7A:
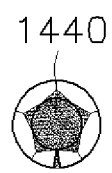
Figure 7B:
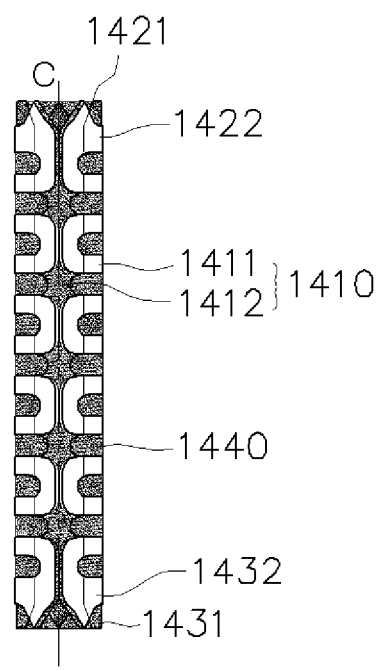

FIGS. 6A, 6B, 6C, 6D, 7A and 7B are drawings illustrating a contact according to a third embodiment of the present invention, wherein FIGS. 6A and 6B depict a left side view and a front view of the deployed state of a flat plate pattern, respectively, FIGS. 6C and 6D depict a plan view and a front view of a contact processed by rolling, respectively, and FIGS. 7A and 7B depict a plan view and a front view of a hybrid type contact filled with a filler, respectively.

With reference to FIGS. 6A to 6D, the flat plate pattern of a contact 1400 according to a present embodiment includes an elastic part 1410 being connected with a plurality of closed loops 1411 of an equal size in series by nodes 1412; an upper head part 1422 being provided with an upper sharp end part 1421 formed protruding upwards and extending from an uppermost end of the elastic part 1410; and a lower head part 1432 being provided with a lower sharp end part 1431 formed protruding downwards and extending from a lowermost end of the elastic part 1410.

The closed loops 1411 composing the elastic part 1410 in the present embodiment have a shape being approximately rectangular with an equal size and an adjacent closed loop 1411 is connected in series type by a single node 1412.

The present embodiment illustrates the upper head part 1422 and the lower head part 1432 having the same unit strip (closed strip) structure as that of the elastic part 1410. However, the upper head part 1422 and the lower head part 1432 are not limited to the present embodiment, and may have various types of shapes such as a rectangular strip other than a closed strip. Preferably, each node is provided on a vertical axis C of the elastic part 1410.

An upper side sharp end part 1421 and a lower sharp end part 1431 may be configured in a plurality of teeth.

The flat plate pattern configured in this manner is bent to allow the elastic part 1410, the upper head part 1422, and the lower head part 1432 to be configured into a cylindrical shape. At this time, bending into the cylindrical shape may be accomplished with the upper head part 1422 and/or the lower head part 1432 being supported as reference points for action.

With reference to FIGS. 7A and 7B, the contact 1400 configured in this manner may be filled with the filler 1440 having conductivity and elasticity inside the cylindrical shape thereof.

Fourth Embodiment

Figure 8A:
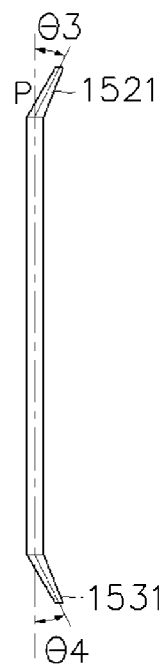
FIGS. 8A, 8B, 8C, 8D, 9A and 9B are drawings illustrating a contact according to a fourth embodiment of the present invention.
Figure 8B:
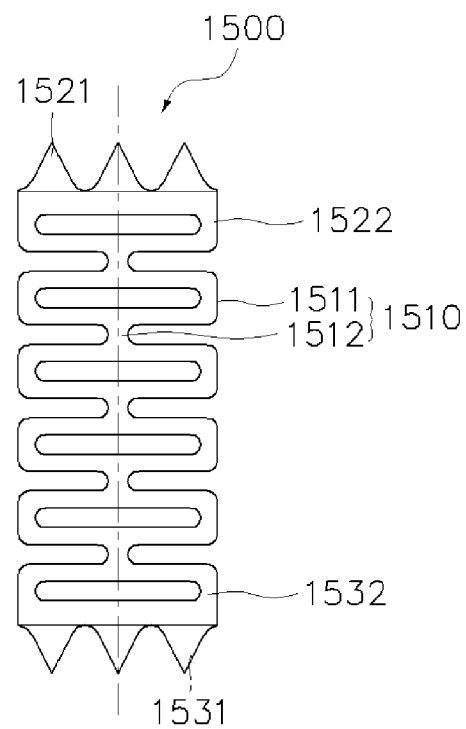
Figure 8C:
Figure 8D:
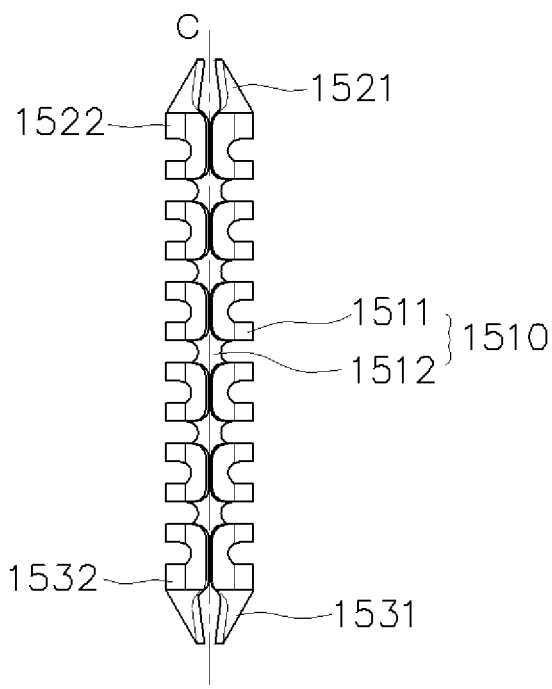
Figure 9A:
Figure 9B:
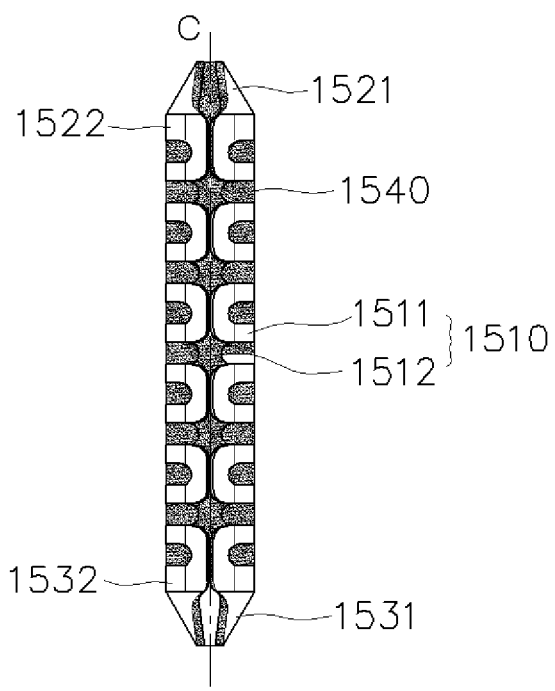

FIGS. 8A, 8B, 8C, 8D, 9A and 9B are drawings illustrating a contact according to a fourth embodiment of the present invention, wherein FIGS. 8A and 8B depict a left side view and a front view of the deployed state of a flat plate pattern, respectively, FIGS. 8C and 8D depict a plan view and a front view of a contact processed by rolling, respectively, and FIGS. 9A and 9B depict a plan view and a front view of a hybrid type contact filled with a filler, respectively.

With reference to FIGS. 8A to 8D, the flat plate pattern of a contact 1500 according to a present embodiment includes an elastic part 1510 being connected with a plurality of closed loops 1511 of an equal size in series by nodes 1512; an upper head part 1522 being provided with an upper sharp end part 1521 formed protruding upwards and extending from an uppermost end of the elastic part 1510; and a lower head part 1532 being provided with a lower sharp end part 1531 formed protruding downwards and extending from a lowermost end of the elastic part 1510.

Specifically, an upper side sharp end part 1521 is configured in a plurality of teeth each having a slope of a pre-set angle θ3 with respect to a plane P of the flat plate pattern. Accordingly the upper side sharp end part 1521 has a conic shape by being bent toward a center of a cylindrical shape. In addition, a lower side sharp end part 1351 is also configured in a plurality of teeth each having a slope of a pre-set angle θ4 with respect to the plane P of the flat plate pattern, thereby having a conic shape by being bent toward the center of the cylindrical shape.

With reference to FIGS. 9A and 9B, the contact 1500 configured in this manner may be filled with the filler 1540 having conductivity and elasticity inside the cylindrical shape thereof.

Hereinafter, the test sockets adopting the above-mentioned contacts will be described in detail.

First Embodiment

Figure 10A:
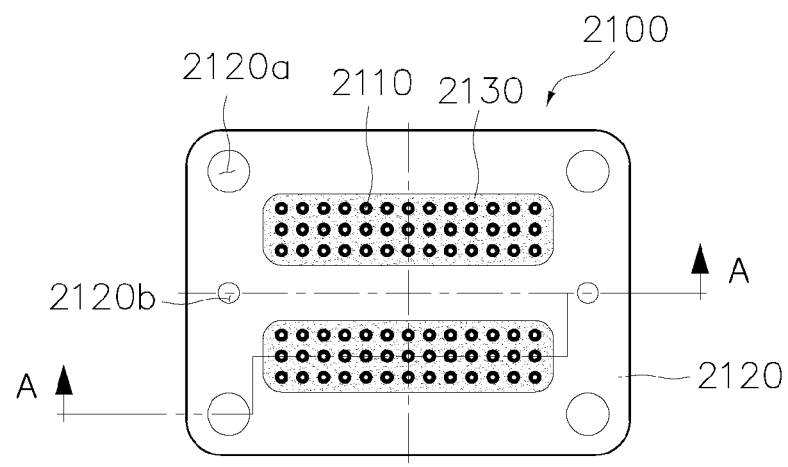
FIGS. 10A and 10B depict drawings illustrating a test socket according to the first embodiment of the present invention.
Figure 10B:
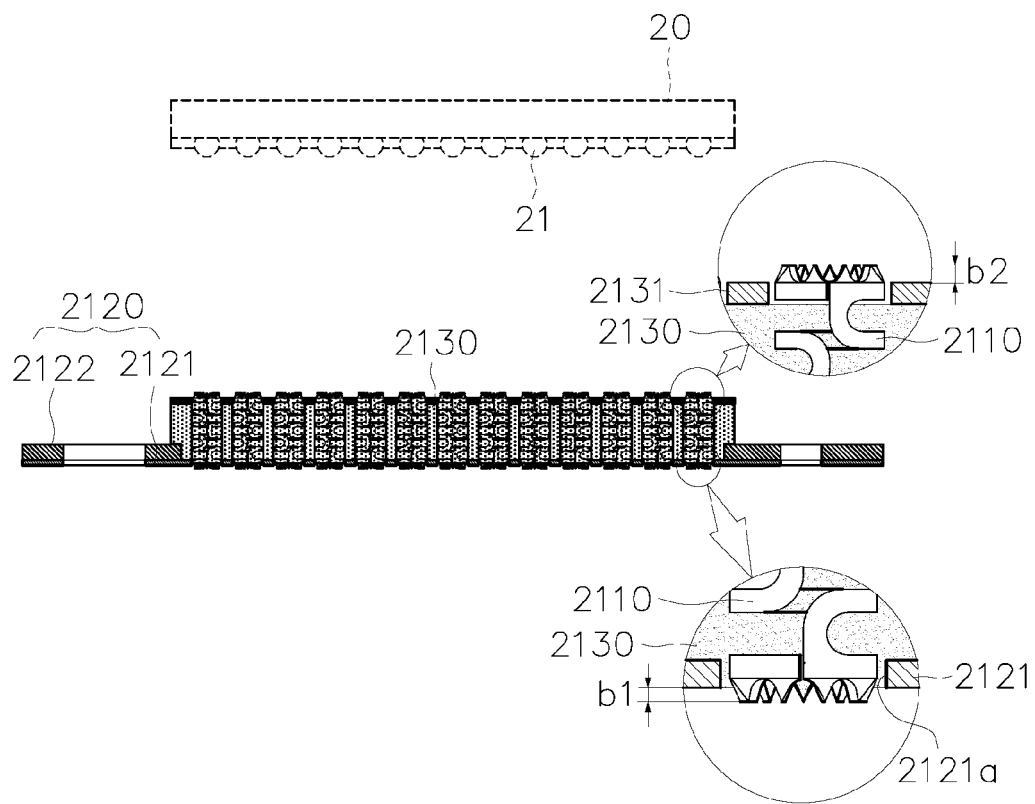

FIGS. 10A and 10B depict drawings illustrating a test socket according to the first embodiment of the present invention, wherein FIG. 10A is a plan view diagram and FIG. 10B a cross-sectional diagram taken along line A-A.

With reference to FIGS. 10A and 10B, a test socket 2100 according to the present embodiment includes a mounting part 2120 being famed with a plurality of through holes 2121*a* corresponding to leads 21 of a device 20, wherein the contacts 2110 are inserted and located in the through holes 2121*a*, and an insulation body part 2130 having elasticity to allow the contacts 2110 to be fastened to the mounting part 2120 in an integrated body.

The mounting part 2120, as a flat plate member, is formed with a plurality of through holes 2121*a* corresponding to the leads 21 of the device 20, whereby a portion of a bottom of each contact 2110 is inserted into the corresponding through hole, and the insulation body part 2130 is provided on a top surface of the mounting part 2120. The mounting part 2120 may be provided with the mounting holes 2120*a* to mount the test socket 2100 therein and guide holes 2120*b* of playing a role to guide assembling position of the test socket 2100.

The mounting part 2120 in the present embodiment may be configured with a first mounting part 2121 of an insulating material such as a resin, and a second mounting part 2122 of composing a socket base consisted of a metal (SUS) or a resin, but not limited to this, and may be used solely with the first mounting part 2121.

The insulation body part 2130, as an insulating material having elasticity, allows the contacts 2110 and the mounting part 2120 to be fastened to each other in an integrated body and the device 20 to be mounted on a top surface thereof.

Meanwhile, a mounting seat 2131 on which the device 20 is to be directly mounted may be added on the top surface of the insulation body part 2130. In addition, the mounting seat 2131 may be provided with a resin having an insulating property.

The insulation body part 2130 may be provided with an insulating silicon fluid. For example, the contacts 2110 are temporarily assembled in the through holes 2121*a* of the mounting part 2120, then a silicon fluid is inserted in the mold and solidified there, by using the mold to shape the insulation body part 2130. Consequentially, the insulation body part 2130 of allowing the mounting part 2120 and the contacts 2110 to be fastened to each other in an integrated body may be completed by removing the mold.

Preferably, the contact 2110 may enhance contact with a pad of a test device with a lower side sharp end part thereof being located protruding by a preset length b1 out of the through holes 2121*a*.

An upper side sharp end part of the contact 2110 may also enhance contact with the lead 21 of the device 20 by protruding by a preset length b2 out of the top surface of the insulation body part 2130, wherein the top surface is to face the device 20. Meanwhile, the device 20 is directly mounted on the mounting seat 2131 provided on the top surface of the insulation body part 2130. At this time, a height of the mounting seat 2131 may be higher than that of the top of the contact 2110, but contact of the leads 21 of the device 20 and the contacts 2110 may be achieved with the mounting seat 2131 being compressed when the device 20 is mounted thereon.

Second Embodiment

Figure 11:
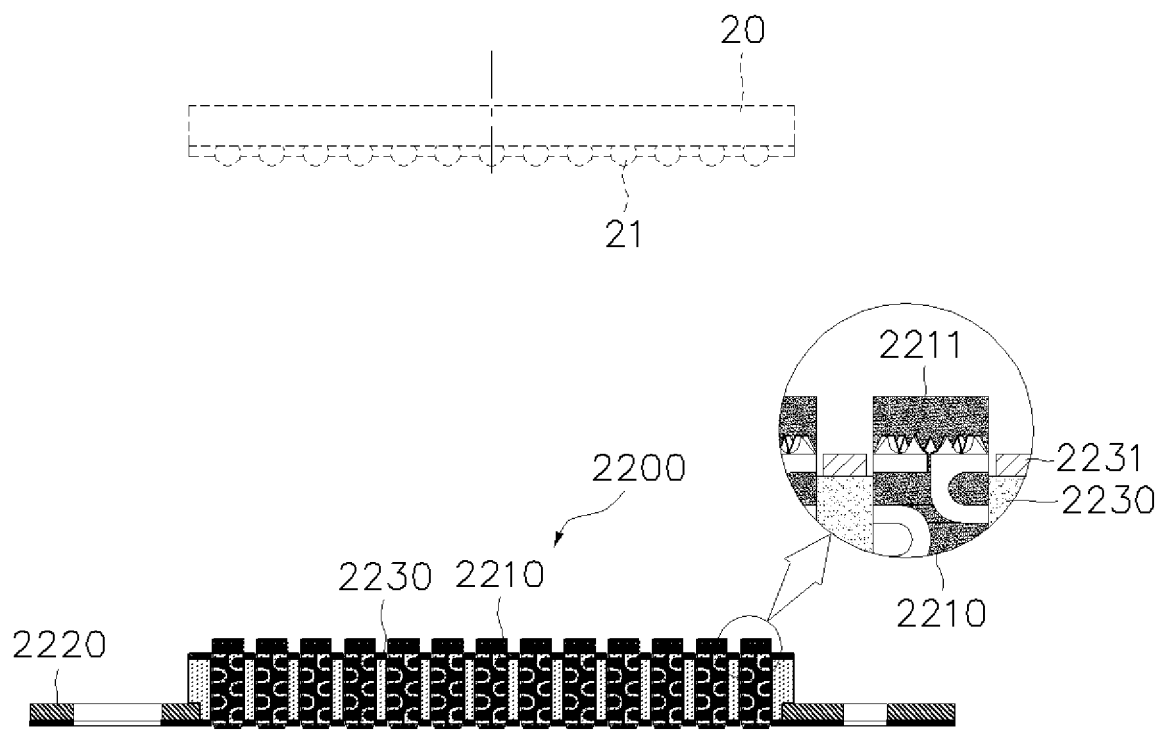
FIG. 11 depicts cross-sectional diagrams illustrating a test socket according to the second embodiment of the present invention.

FIG. 11 depicts cross-sectional diagrams illustrating a test socket according to the second embodiment of the present invention, and a description will be focused on points different from the first embodiment, omitting a description overlapping with the first embodiment.

With reference to FIG. 11, a test socket 2200 according to the present embodiment includes a mounting part 2220 being formed with a plurality of through holes corresponding to leads 21 of a device 20, wherein hybrid contacts 2210 are inserted and located in the through holes, and an insulation body part 2230 having elasticity to allow the hybrid contacts 2210 to be fastened to the mounting part 2220 in an integrated body.

The mounting part 2220, as a flat plate member, is formed with a plurality of through holes corresponding to the leads 21 of the device 20, whereby a portion of a bottom of each hybrid contact 2210 is inserted into the corresponding through hole, and the insulation body part 2230 is provided on a top surface of the mounting part 2220. The mounting part like this may be a two-layer structure composed of homogeneous or heterogeneous materials as described in the first embodiment.

Specifically, the hybrid contacts 2210 of this embodiment are configured by filling fillers having conductivity and elasticity in the contacts each configured in an integrated body by being rolled into a cylindrical shape illustrated before.

The insulation body part 2230, as an insulating material having elasticity, allows the hybrid contacts 2210 and the mounting part 2220 to be fastened to each other in an integrated body, and the device 20 to be mounted on a top surface thereof. As described in the first embodiment, the insulation body part 2230 allows the mounting part 2220 and the hybrid contacts 2210 to be fastened to each other in an integrated body by solidifying an insulating silicon fluid. In addition, the mounting seat 2231 of an insulating material may be added on the top surface of the insulation body part 2230, whereby the device 20 is to be directly mounted thereon.

Preferably, a bumper contact part 2211 having conductivity and elasticity may be added on the top of each hybrid contact 2210, wherein the bumper contact parts 2211 may reduce abrasion of the hybrid contacts 2210 with interposition of contact between the hybrid contacts 2210 and the leads 21 of the device 20. Meanwhile, the bumper contact parts as described may be equally applied to the contacts in the first embodiment.

Third Embodiment

Figure 12:
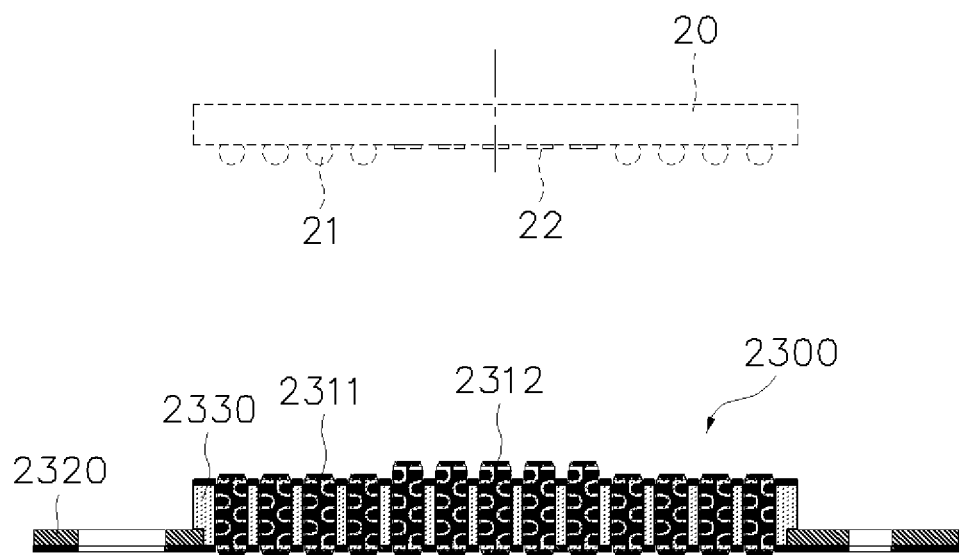
FIG. 12 depicts cross-sectional diagrams illustrating a test socket according to the third embodiment of the present invention.

FIG. 12 depicts cross-sectional diagrams illustrating a test socket according to the third embodiment of the present invention.

With reference to FIG. 12, a test socket 2300 according to the present embodiment may be equipped with homogeneous (or heterogeneous) contacts 2311 (or hybrid contacts 2312) having different heights depending on leads 21 or 22 of a device 20.

In the case of a composite type device 20 being mixed with ball type leads 21 and land type leads 22 depending on devices, the contacts 2311 or 2312 appropriate to each lead may be provided. At this time, contacts (or hybrid contacts) of a BGA type or an LGA type are used for the contacts 2311 or 2312, a contact appropriate to each lead is temporarily assembled on a mounting part 2320, and the mounting part 2320 and the contacts 2311 or 2312 may be allowed to be fastened to each other by solidifying an insulating silicon fluid in the same way as in the foregoing embodiments.

As illustrated, although the present disclosure has been described through limited numbers of exemplary embodiments and drawings, the present invention is not limited to this. Accordingly, those skilled in the art will appreciate that various modifications, additions and substitutions are possible, without departing from the technical scope and spirit of the present invention and those equivalent to claims to be described below.

What is claimed is:

1. A contact configured in an integrated body by blanking a metal board and rolling the metal board into a cylindrical shape, the contact comprising:
    an elastic part being bent into a cylindrical shape by being connected in a zigzag pattern with unit strips each composed of a horizontal strip and a vertical strip extending perpendicularly from one end of the horizontal strip and having a shorter length than the horizontal strip;
    an upper head part being bent into a cylindrical shape by being provided with an upper sharp end part formed by protruding upwards and extending from an uppermost end of the elastic part;
    a lower head part being bent into a cylindrical shape by being provided with a lower sharp end part formed by protruding downwards and extending from a lowermost end of the elastic part; and
    a filler having conductivity and elasticity by being filled in a cylindrical shape into an elastic section at least between the upper head part and the lower head part.

2. The contact of claim 1, wherein the elastic part is bent into the cylindrical shape by taking a center of the horizontal strip as a vertical axis.

3. The contact of claim 1, wherein the upper sharp end part is a plurality of teeth formed by protruding upwards.

4. The contact of claim 3, wherein the upper sharp end part has a plurality of teeth configured in a conic shape.

5. The contact of claim 1, wherein the lower sharp end part is a plurality of teeth formed by protruding downwards.

6. The contact of claim 5, wherein the lower sharp end part has a plurality of teeth configured in a conic shape.

7. A contact configured in an integrated body by blanking a metal board and rolling the metal board into a cylindrical shape, the contact comprising:
    an elastic part being bent into a cylindrical shape by being connected with a plurality of closed loop strips of an equal size in series by nodes;
    an upper head part being bent into a cylindrical shape by being provided with an upper sharp end part formed by protruding upwards and extending from an uppermost end of the elastic part;
    a lower head part being bent into a cylindrical shape by being provided with a lower sharp end part formed by protruding downwards and extending from a lowermost end of the elastic part; and
    a filler having conductivity and elasticity by being filled in a cylindrical shape into an elastic section at least between the upper head part and the lower head part.

8. The contact of claim 7, wherein the nodes are provided on a vertical axis of the elastic part.

9. The contact of claim 7, wherein the upper sharp end part is a plurality of teeth formed by protruding upwards.

10. The contact of claim 9, wherein the upper sharp end part has a plurality of teeth configured in a conic shape.

11. The contact of claim 7, wherein the lower sharp end part is a plurality of teeth formed by protruding downwards.

12. The contact of claim 11, wherein the lower sharp end part has a plurality of teeth configured in a conic shape.

13. A test socket including the contact according to claim 1, the test socket comprising:
    a mounting part being formed with a plurality of through holes in each of which the contact is inserted and located corresponding to a lead of a device; and
    an insulation body part having elasticity to allow the contact to be fastened to the mounting part in an integrated body.

14. The test socket of claim 13, wherein the mounting part includes an insulating flat plate member formed with holes for mounting and holes for guiding an assembling position.

15. The test socket of claim 13, wherein the mounting part includes:
    a first mounting part being formed with the through holes and supporting the insulation body part; and
    a second mounting part being mounted and located on a top of the first mounting part,
    wherein the first mounting part and the second mounting part are formed to have holes for mounting and holes for guiding an assembling position, each of the holes being penetrated.

16. The test socket of claim 13, further comprising:
    a mounting seat on a top of the insulation body part, the mounting seat having electrical insulation property and being formed with holes formed corresponding to the through holes.

17. The test socket of claim 16, wherein the contact has a lower side sharp end part being located by protruding out of corresponding one of the through holes and an upper side sharp end part being located by protruding out of a top of the mounting seat to face the device.

18. The test socket of claim 16, wherein the contact has the upper sharp end part being located lower than the top of the mounting seat to face the device.

19. The test socket of claim 13, wherein the contact further includes a bumper contact part having conductivity and elasticity on a top thereof.

20. The test socket of claim 13, wherein the test socket is provided with a plurality of contacts having different heights, thereby allowing a test for a composite type device having heterogeneous leads to be possible.

21. A test socket including the contact according to claim 7, the test socket comprising:
    a mounting part being formed with a plurality of through holes in each of which the contact is inserted and located corresponding to a lead of a device; and
    an insulation body part having elasticity to allow the contact to be fastened to the mounting part in an integrated body.

22. The test socket of claim 21, wherein the mounting part includes an insulating flat plate member formed with holes for mounting and holes for guiding an assembling position.

23. The test socket of claim 21, wherein the mounting part includes:
    a first mounting part being formed with the through holes and supporting the insulation body part; and
    a second mounting part being mounted and located on a top of the first mounting part,
    wherein the first mounting part and the second mounting part are formed to have holes for mounting and holes for guiding an assembling position, each of the holes being penetrated.

24. The test socket of claim 21, further comprising: a mounting seat on a top of the insulation body part, the mounting seat having electrical insulation property and being formed with holes formed corresponding to the through holes.

25. The test socket of claim 24, wherein the contact has a lower side sharp end part being located by protruding out of corresponding one of the through holes and an upper side sharp end part being located by protruding out of a top of the mounting seat to face the device.

26. The test socket of claim 24, wherein the contact has the upper sharp end part being located lower than the top of the mounting seat to face the device.

27. The test socket of claim 21, wherein the contact further includes a bumper contact part having conductivity and elasticity on a top thereof.

28. The test socket of claim 21, wherein the test socket is provided with a plurality of contacts having different heights, thereby allowing a test for a composite type device having heterogeneous leads to be possible.

* * * * *